United States Patent [19]

Perlow

[11] 4,295,107
[45] Oct. 13, 1981

[54] IMPEDANCE TRANSFORMATION NETWORK

[75] Inventor: Stewart M. Perlow, Marlboro, N.J.

[73] Assignee: RCA Corporation, New York, N.Y.

[21] Appl. No.: 117,238

[22] Filed: Jan. 31, 1980

[51] Int. Cl.³ .......................... H03H 7/38; H03H 7/42
[52] U.S. Cl. ...................................... 333/25; 333/32; 333/263
[58] Field of Search ........................ 333/25, 26, 32, 33

[56] References Cited

U.S. PATENT DOCUMENTS

| | | | |
|---|---|---|---|
| 2,358,520 | 9/1944 | Landon | 333/25 X |
| 2,539,651 | 1/1951 | Woodward, Jr. | 333/26 X |
| 2,709,219 | 5/1955 | Schmidt, Jr. | 333/25 UX |
| 3,373,373 | 3/1968 | McClure | 333/25 X |

OTHER PUBLICATIONS

Nagle, *Use Wideband Autotransformers in RF Systems*, Electronic Design 3, Feb. 2, 1976, pp. 64–70.

*Primary Examiner*—Paul L. Gensler
*Attorney, Agent, or Firm*—E. M. Whitacre; P. J. Rasmussen; P. M. Emanuel

[57] ABSTRACT

An impedance transformation network includes a trifilar wire configuration in which each of three conductors, each having first and second respective ends, is equally spaced with respect to one another over a predetermined length. A substantial portion of the trifilar wire is surrounded by a ferrite material. The first and second ends of a first conductor are connected to first and second connection points of a first circuit. The first end of a second conductor is connected to a first connection point of a second circuit. The second end of the second conductor is connected to a second connection point of the second circuit. The second end of the second conductor and the first end of the third conductor are connected to a third connection point of the second circuit. Where the second connection point of the first circuit and the third connection point of the second circuit are signal ground points, the network serves as a balun. Where the impedance presented by the second circuit is four times greater than the impedance presented by the first circuit, the characteristic impedance between any two conductors is desirably made equal to twice the impedance presented by the first circuit to provide a one to four impedance transformation ratio. Additional circuitry is provided for extending the impedance transformation ratio of the network and for minimizing its VSWR.

12 Claims, 4 Drawing Figures

IMPEDANCE TRANSFORMATION NETWORK

BACKGROUND OF THE PRESENT INVENTION

The present invention pertains to impedance transformation networks typically employed with RF circuitry of a television receiver.

Impedance transformation networks are utilized in RF circuitry to step up or step down the impedance level between pairs of ports of input and output circuits with different source and load impedances, respectively. Most often the impedance transformation network is arranged so that the load impedance provided to the input circuit by the impedance transformation network matches as nearly as possible the source impedance of the input circuit and the source impedance provided to the output circuit by the impedance transformation network matches as nearly as possible the load impedance of the output circuit. Impedance matching is desirable since under these conditions there is a maximum power transfer and a minimum of signal distortion between the input and output circuits.

For these reasons, an impedance transformation network is generally coupled between a UHF television antenna network typically having an impedance of 75 ohms and UHF RF signal processing circuitry included in the receiver typically having an impedance of approximately 300 ohms. In such an arrangement, the impedance transformation network not only matches the impedance levels of the antenna network and RF circuitry as nearly as it can, but is additionally arranged to provide transformation between a balanced impedance configuration of the antenna network to the unbalanced impedance configuration of the RF circuitry of the receiver. A balanced impedance configuration is one in which the impedances between each of two points of a network to signal ground are equal. An unbalanced impedance configuration is one in which the impedances between each of two points of a network to signal ground are not equal. This occurs most frequently when one of the two points is connected to signal ground. An impedance transformation network for coupling a balanced impedance network to an unbalanced impedance network is generally called a balun.

When impedances are not matched distortion may arise due to the establishment of signal reflections at the ports of both the input and output circuits. A factor of merit referred to as the voltage standing wave ratio or VSWR indicates the amount of impedance mismatch between an input and an output circuit and is accordingly indicative of the amount of signal distortion between the input and output circuit. Therefore, it is desirable that an impedance transforming network provide the lowest possible VSWR (unity being the theoretical minimum VSWR).

Impedance transformation networks with a low VSWR are not only desirable for use between an antenna network and the RF circuitry of a television receiver but are also desired for use in an arrangement for testing the noise performance of portions of the receiver such as the RF circuitry. In such a testing arrangement, a noise signal of known amplitude is applied to the antenna input of a receiver through an impedance transformation network and the noise signal amplitude is measured at a desired point in the RF circuitry. A comparison of the noise signal amplitudes at the antenna input and the measurement point provides an indication of the noise contributed or rejected by the RF circuitry.

It has been found that the accuracy of noise measurement is adversely affected by impedance mismatches between the noise source and antenna input. In more precise terms, the accuracy of the measurement is rapidly degraded with increases in the VSWR of the impedance transformation network. Accordingly, impedance transformation networks which provide a desired impedance transformation ratio (e.g., one to four) substantially uniformly throughout the frequency range of interest (e.g., the UHF range approximately 300 MHz to 900 MHz) are desired.

A variety of impedance transformation networks are known. Those employing a simple transformer with single conductor primary and secondary windings about a ferrite core tend to have poor high frequency response characteristics since they exhibit less magnetic coupling and more stray parasitic reactances as the frequency increases. Those employing simple transmission lines tend to have limited bandwidths since their low frequency response is adversely effected by the formation of undesired parasitic transmission line structures to structural members at signal ground potential.

Impedance transformation networks having a hybrid structure combining transmission line with a ferrite core have been employed in high frequency-broadband applications since they obviate the deficiencies of the impedance transformation individual simple structures. Typically they include two separate transmission lines each having two conductors uniformly spaced from one another in what is often referred to as a bifilar wire configuration. Each bifilar wire is wound around a ferrite core and often passes through a respective aperture in the ferrite core. The ends of the conductors of the two bifilar wires are connected so as to provide the desired impedance transformation.

Since such hybrid impedance transformation networks typically require two bifilar wires wound around a ferrite, they tend to be relatively difficult to manufacture. In addition, it has been found that many hybrid impedance transformation networks including bifilar windings do not provide a sufficiently low VSWR over the entire frequency range of interest for accurate noise measurements.

SUMMARY OF THE PRESENT INVENTION

The present invention concerns an impedance transformation including a trifilar wire configuration, i.e., one having three conductors substantially uniformly spaced from one another. Preferably, at least the second and third conductors are substantially equally spaced from the first and, desirably, all three conductors are substantially equally spaced from one another. Means are provided for substantially isolating the conductors of the trifilar wire from signal ground potential, e.g., by substantially enclosing them in a ferrite sleeve. The opposite ends of the first conductor are connected to respective signal and signal reference points of a first circuit. Opposite first ends of the second and third conductors are connected to respective first and second signal points of a second circuit and opposite second ends of the second and third conductors are connected to a signal reference point of the second circuit. When the preferred conductor configuration is employed, the impedance provided between the signal and reference points of the first circuit will be substantially equal to one-half the characteristic impedance between the first and second conductors and the first and third conductors and the impedance provided between the first and second signal points of the second circuit will be substantially equal to twice the characteristic impedance between the second and third conductors. If the conductors are equally spaced from one another, the configuration provides a one-to-four impedance transformation ratio.

DETAILED DESCRIPTION OF THE DRAWING

Figure 1:
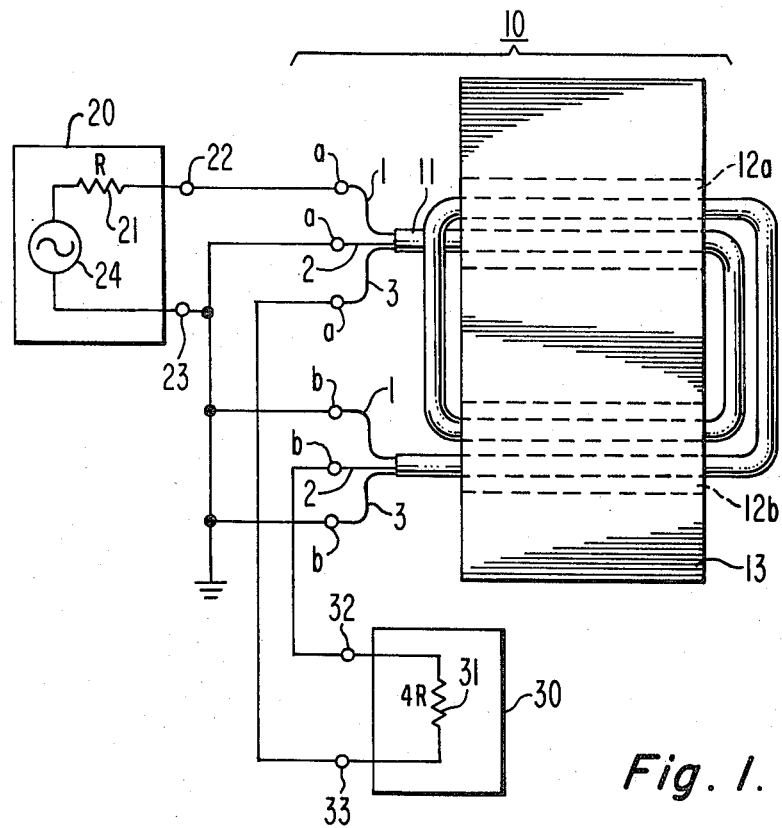
FIG. 1 is a schematic of a preferred implementation of the present impedance transformation network.

In the arrangement shown in FIG. 1, an impedance transformation network 10 is coupled between a signal source circuit 20 and a load circuit 30. Network 10 is arranged as described below to provide an impedance substantially equal to source impedance 21, shown simply as a resistor of value R, of source circuit 30 between output terminals 22 and 23 and to provide another impedance substantially equal to load impedance 31, shown simply as a resistor of value 4R, of load circuit 30 between input terminals 32 and 33. In addition, Network 10 transforms the unbalanced impedance configuration in which the impedances between each of output terminals 22 and 23 and a signal ground point are unequal, provided by virtue of the connection of terminal 23 to the signal ground point, to the balanced impedance configuration of load 30 in which the impedances between each of input terminals 32 and 33 and the signal ground point are substantially the same.

Figure 2:
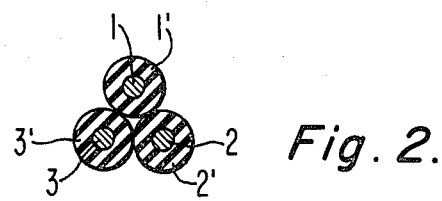
FIG. 2 is a cross-sectional view of the preferred configuration of wire utilized in the implementation of FIG. 1.

Impedance transformation network 10 includes a trifilar wire 11, having three conductors 1, 2 and 3, uniformly separated from one another by a dielectric material which is wound through apertures 12a and 12b of a ferrite core 13. Desirably, at least two of the conductors of the wire are substantially equidistant from the third. Preferably the conductors are all equidistant from one another. As indicated in FIG. 2, this may be accomplished by fastening the dielectric sleeves (1', 2' and 3') of three identical wires together so that conductors, in cross section, define an equilateral triangle. Substantially the same result will be produced by twisting three separate identical wires together.

Opposite ends a and b of each of conductors 1, 2 and 3 are connected to terminals 22 and 23 of source circuit 20, load circuit 30 and a signal point to produce the desired impedance transformation discussed above in the following manner. Opposite ends a and b of conductor 1 are connected to output terminals 22 and 23 of source circuit 20, respectively. Opposite ends a and b of conductor 2 are connected to signal ground and to input terminal 32 to load circuit 30, respectively. Opposite ends a and b of conductor 3 are connected to input terminal 33 and to signal ground, respectively.

The high frequency response of impedance transformation network 10 is an inverse function of the length of trifilar winding 11. To ensure that the response is adequate at the highest frequency of interest, it is desirable that the length of trifilar wire 11 be substantially less than the corresponding wavelength, e.g., less than one-eighth of the corresponding wavelength. The low frequency response of impedance transformation network is adversely effected by the formation of parasitic elements between conductors 1, 2 and 3 and any structural element, such as a chassis housing (not specifically shown) connected to the signal ground point. Enclosing as much as possible of trifilar wire 11 in ferrite core 13 serves to inhibit the formation of parasitic elements between conductors 1, 2 and 3 and structures at signal ground potential. The greater the number of turns of trifilar wire 11 through core 13, the greater the ratio of its enclosed portion to its unenclosed portion and the better the low frequency response. Accordingly, there is a compromise situation between a large number of turns for improved low frequency response and a small length for improved high frequency response. For the UHF range between 299 and 900 MHz with a ferrite core 3/32 inches in length, 3 turns have been found to produce acceptable results.

It is noted that since the overall length of wire 11 is much less than a wavelength, the portions overlapping each other within apertures 12a and 12b will overlap each other only at fractions of the overall length. Accordingly, the interaction between conductors in different turns will be insignificant and may, for the most part, be ignored.

Figure 3:
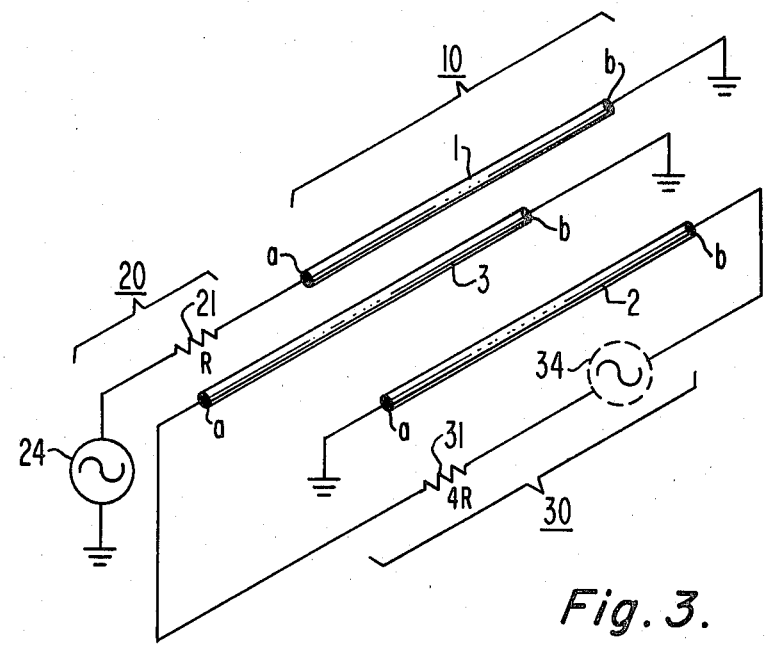
FIG. 3 is a schematic, partially in isometric form, of a circuit equivalent for the impedance transformation network of FIG. 1 useful in understanding its operation.

The circuit of FIG. 3 is drawn partially in isometric form to show the physical relationship between conductors 1, 2 and 3 to facilitate an understanding of how its impedance transformation ratio is obtained. Theoretically, in the circuit equivalent of impedance transformation network 10, each pair of two conductors forms an ideal transmission line. It will be understood that the following description pertains to this theoretical equivalent circuit and may deviate somewhat from actual structures constructed in accordance with the present invention.

The voltage generated by voltage source 24 of source circuit 20 causes a current to flow in conductor 1. The latter current causes currents of substantially equal sense and magnitude to flow in conductors 2 and 3. Since the current in each of conductors 2 and 3 is the same and the impedance at respective points along the length of each is the same, the voltage at respective points along the length of each is the same. Accordingly, with respect to source circuit 20, conductors 2 and 3 are effectively shorted together at respective points along their length. As a result, the impedance presented to source circuit 20 by impedance transformation network 10 is the parallel combination of the characteristic impedance of the transmission line formed by conductors 1 and 2 with the characteristic impedance of the transmission line formed by conductors 1 and 3. If the characteristic impedances of the latter transmission lines are made substantially equal to 2R, the impedance presented by impedance transformation network 10 to source circuit 10 will be R and therefore its source impedance of R will be matched.

To determine the impedance that impedance transformation network 10 presents to load circuit 30, momentarily consider load circuit 30 as including a voltage source 34. Voltage source 34 will cause currents of equal magnitude, but opposite sense to flow in conductors 2 and 3. The latter currents cause currents of equal magnitude but opposite sense to flow in conductor 1 which combine to cancel one another. Accordingly, with respect to load circuit 30 the transmission lines formed by conductors 2 and 1 and conductors 3 and 1 effectively have infinite impedances. As a result, the impedance that impedance transformation network 10 presents to load circuit 30 is the sum of the impedance between end a of conductor 2 and end a of conductor 3 and the impedance between end b of conductor 2 and end b of conductor 3, or twice the characteristic impedance of the transmission line between conductors 2 and 3. If the characteristic impedance of the latter transmission line is made 2R, the impedance presented by impedance transformation network 10 to load circuit 30 will be 4R and therefore its load impedance of 4R will be matched.

From the foregoing, it will be noted that if conductors 1, 2 and 3 of trifilar wire 11 are uniformly and equally spaced from one another, a one to four impedance transformation ratio will be substantially obtained. It is desirable, therefore, to select the characteristic impedance between any two conductors to be substantially equal to twice the source impedance (or one-half the load impedance).

An impedance transformation network constructed like impedance transformation network 10 of FIG. 1 has been found to provide a VSWR no higher than 1.5 to 1 throughout the frequency range between 300 and 900 kHz. This is believed to result from its almost symmetrical structure as illustrated in FIG. 3.

Figure 4:
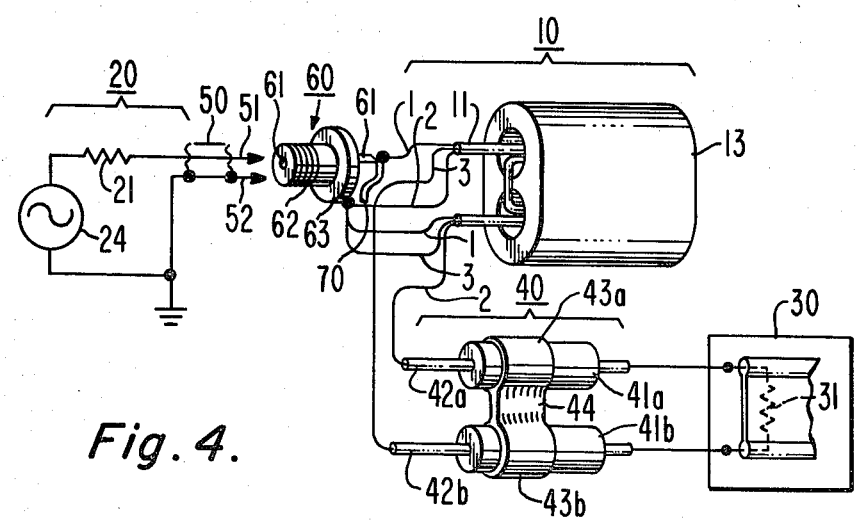
FIG. 4 shows, partially in isometric form, apparatus for extending the impedance transformation ratio of the impedance transformation network of FIG. 1.

The arrangement shown in FIG. 4 is directed at additional circuitry for extending the impedance transformation ratio of impedance transformation network 10. Elements in the arrangement of FIG. 4 corresponding to those in FIGS. 1-3 are identified by the same reference numbers.

Need for extending the impedance transformation ratio of network 10 may arise when the ratio between source impedance 21 and load impedance 31 is less than one to four. For example, in noise measurements of the UHF RF circuitry of a television receiver, a noise generator, such as model number 7015 commercially available from the ALLTECH, Inc., having a source impedance of 50 ohms may be employed. Since the typical input impedance of the UHF RF circuitry is approximately 300 ohms, the impedance transformation ratio provided by network 10 is not sufficient.

In the arrangement of FIG. 4, an additional impedance transformation network 40 is coupled between source circuit 20 having a source impedance 21 of 50 ohms and a load circuit 30 having a load 31, illustrated as a twin lead transmission line such as conventionally coupled between the UHF antenna input terminals and the associated RF tuner circuitry of a television receiver, of 300 ohms. Additional network 40 extends the impedance transformation ratio of impedance transformation network 10 from four to one to approximately six to one.

Network 40 includes carbon composition resistors 41a and 41b having equal values, each connected between an output terminal of impedance transformation network 10 and a respective input terminal of load circuit 30. Resistors 41a and 41b are positioned so that their leads 42a and 42b, respectively, connected to the output terminals of network 10, are substantially parallel. Leads 42a and 42b form a transmission line. The space between them defines the characteristic impedance of the transmission line. Desirably, the length of leads 42a and 42b is less than one-eighth of a wavelength at the highest frequency of interest.

Conductive sleeves 43a and 43b made, e.g., from copper or brass, surround each of resistors 41a and 41b, respectively. Sleeves 43a and 43b are joined by a conductive strap 44 which desirably is made integral with sleeves 43a and 43b. Sleeves 43a and 43b are slideable along resistors 42a and 42b and may be slid to extend over leads 42a and 42b. Sleeves 43a and 43b are variable capacitive tuning elements, the function of which is described below.

The value of resistors 41a and 41b is selected to make up the difference between the impedance provided by network 10 and the desired impedance. Since the higher the value of resistors 41a and 41b, the greater the loss between signal source 20 and load circuit 30, a compromise value is desirably selected. A value of 33 ohms for resistors 41a and 41b, providing together with network 10 a combined impedance of 266 ohms, was found to provide a suitable compromise between a matched impedance condition and a low loss condition.

The characteristic impedance of the transmission line defined by leads 42a and 42b is selected to provide approximately the correct reactive component of the combined impedance in order to provide the lowest possible VSWR at the highest frequency of interest. This is best determined experimentally by adjusting the separation between leads 42a and 42b. Once the proper separation is determined, the combination of sleeves 43a, 43b and strap 44 is made to maintain the separation. The longitudinal position of sleeves 43a and 43b is adjusted to fine tune the reactive component to provide the lowest possible VSWR.

Additional reactive tuning is provided at the signal source input of impedance transformation network 10. Signal source 20 is coupled to impedance transformation network 10 through a coaxial cable 50 and a coaxial connector 60. For the sake of simplicity of drawing, the coaxial connectors at the ends of cable 50 by which it is connected to signal source 20 and coaxial connector 60 are not shown. Center conductor 51 of coaxial cable is connected to a center conductor 61 of coaxial connector 60. Outer conductor 52 of cable 50 is connected to shell 62 of connector 60. Accordingly, signal is present at center conductor 61 of connector 60 and signal ground potential is present at shell 62. Conductors 1, 2 and 3 of impedance transformation network 10 are connected to the signal source and signal ground points provided at center conductor 61 and shell 62, respectively, in the same manner as shown in FIGS. 1 and 3.

To provide the reactive fine tuning at the signal source input of impedance transformation network 10, a conductive strip 70, e.g., made from brass or copper, is attached at one end to center conductor 61 of coaxial connector 60. The other end of strip 70 is bent to be within close proximity of base or flange 63 of connector 60 to form a variable tuning capacitor to signal ground. The distance between strip 70 and flange 63 is adjusted to obtain the lowest possible VSWR.

The impedance transformation network of FIG. 4, including network 40 and strip 70, has been found to provide a VSWR as low as 1.12:1 substantially uniformly through the UHF range.

While the impedance transformation network 10 of FIGS. 1 and 4 has been shown as including more than one turn to surround as much as possible of trifilar wire 11 in ferrite core 13, substantially the same result will be produced with a single turn if the axial length of ferrite core is increased accordingly. In addition, it will be appreciated that although impedance transformation network 10 was described in an application requiring a step-up impedance transformation network, impedance transformation network 10 may be used as a step-down impedance transformation network between a signal source having a relatively high impedance to a load circuit having a relatively low impedance. For example, network 10 may be coupled as a balun between a 300 ohm antenna network and a 75 ohm television RF signal processing circuit. Furthermore, while in the arrangements of FIGS. 1, 3 and 4, the input and output connections of network 10 share a common signal ground point, the input and output circuits may be connected to electrically isolated signal ground points. These and other modifications are intended to be included in the present invention defined by the following claims.

What is claimed is:

1. Apparatus comprising:
first circuit for processing RF signals in a predetermined frequency range having a signal connection point and a signal reference point for signals developed at said signal connecting point of said first circuit;
a second circuit for processing RF signals in said predetermined frequency range having first and second signal connection points and a signal reference point for signals developed at said first and second signal connection points of said second circuit;
a trifilar wire configuration having three conductors substantially equally spaced with respect to one another throughout a predetermined length of said wire configuration between first and second ends, said predetermined length being substantially shorter than the wavelength of the highest frequency signal in said predetermined range, each of said conductors having first and second ends respectively connected to points respectively located at said first and second ends of said predetermined length, said first and second ends of said first conductor being connected to said signal connection and signal reference points, respectively, of said first circuit, said first end of said third conductor being connected to said first signal connection point of said second circuit, said second end of said second conductor being connected to said second signal connection point of said second circuit, and said first end of said second conductor and said second end of said third conductor being connected to said signal reference point of said second circuit, there being no DC signal paths connected directly between said signal connection point of said first circuit and each of said first and second signal connection points of said second circuit; and
a ferrite member having a generally cylindrical shape with two apertures formed through it through which said trifilar wire configuration is wound, said apertures having lengths such that the substantial portion of said predetermined length is surrounded by ferrite material.

2. The apparatus recited in claim 1 wherein:
said first circuit has a first predetermined impedance between said signal connection and signal reference points;
said second circuit has a second predetermined impedance between said first and second signal connection points, said second predetermined impedance being substantially four times greater than said first predetermined impedance; and
each pair of said three conductors provides a characteristic impedance substantially equal to twice said first predetermined impedance.

3. The apparatus recited in claim 1 wherein:
said conductors of said trifilar wire configuration in cross-section define corners of an equilateral triangle.

4. The apparatus recited in claim 3 wherein:
said trifilar wire configuration includes three separate but substantially identical wires which are joined together.

5. The apparatus recited in claim 3 wherein
said trifilar wire configuration includes three separate but substantially identical wires which are twisted together.

6. The apparatus recited in claim 1 wherein:
said second circuit includes third and fourth signal connection points; a first resistor connected between said first and third signal connection points; a second resistor connected between said second and fourth signal connection points.

7. The apparatus recited in claim 6 wherein:
said first resistor includes a resistor body and a lead connected between said first connection point at said second circuit and said body;
second resistor includes a resistor body and a lead connected between said second connection point of said second circuit and said body; and
said leads are positioned so that they are substantially parallel to one another.

8. The apparatus recited in claim 7 wherein:
said leads have a length substantially less than a wavelength at the highest frequency in said range.

9. The apparatus recited in claim 8 wherein:
said second circuit includes means for adjusting the capacitance between said leads.

10. The apparatus recited in claim 9 wherein:
said means for adjusting the capacitance between said leads includes
a first conductive sleeve slideably mounted over at least a portion of said body of said first resistor;
a second conductive sleeve slideably mounted over at least a portion of said body of said second resistor; and
a conductive element connected between said first and second sleeves.

11. The apparatus recited in claim 10 wherein:
said first circuit includes means for adjusting the capacitance between said signal connection and signal reference points of said first circuit.

12. The apparatus recited in claim 11 wherein:
said means for adjusting the capacitance between said signal connection and signal reference points of said first circuit includes:
a coaxial connector having an inner and an outer conductor, said inner conductor being connected in series between said first connection point of said first circuit and said first end of said first conductor, said outer conductor being connected in series between said second connection point of said first circuit and said second end of said second conductor; and
a tab having a first end connected to one of said inner and outer conductors and a second end positioned in close proximity to the other one of said conductors of said coaxial connector.

\* \* \* \* \*